United States Patent
Fukushi et al.

(10) Patent No.: US 7,212,430 B2
(45) Date of Patent: May 1, 2007

(54) SEMICONDUCTOR MEMORY

(75) Inventors: Isao Fukushi, Kawasaki (JP); Shoichiro Kawashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 57 days.

(21) Appl. No.: 11/134,332

(22) Filed: May 23, 2005

(65) Prior Publication Data
US 2006/0146590 A1    Jul. 6, 2006

(30) Foreign Application Priority Data
Jan. 6, 2005    (JP) ............................. 2005-001508

(51) Int. Cl.
  *G11C 11/22*    (2006.01)
  *G11C 11/42*    (2006.01)
  *G11C 7/02*     (2006.01)
(52) U.S. Cl. ...................... 365/145; 365/65; 365/207
(58) Field of Classification Search ................ 365/145, 365/65
See application file for complete search history.

(56) References Cited

U.S. PATENT DOCUMENTS

| 2004/0042286 A1* | 3/2004 | Kato et al. .................. 365/200 |
| 2004/0047172 A1* | 3/2004 | Komatsuzaki .............. 365/145 |
| 2005/0254282 A1* | 11/2005 | Summerfelt et al. ........ 365/145 |

FOREIGN PATENT DOCUMENTS

| JP | 2000-195278 | 7/2000 |
| JP | 2002-133857 | 5/2002 |
| JP | 2003-197869 | 7/2003 |
| KR | 2000-43969 A | 7/2000 |

OTHER PUBLICATIONS

Shoichiro Kawashima, et al, "Bitline GND Sensing Technique for Low-Voltage Operation FeRAM", IEEE Journal of Solid-State Circuits, vol. 37, No. 5, May 2002, pp. 592-598.

* cited by examiner

*Primary Examiner*—Amir Zarabian
*Assistant Examiner*—Ly Duy Pham
(74) *Attorney, Agent, or Firm*—Arent Fox LLP

(57) ABSTRACT

A ferroelectric memory has a plurality of memory cells respectively having a cell transistor and ferroelectric capacitor whose one terminal is connected with the cell transistor, a plurality of word lines respectively connected with said cell transistor, a plurality of plate lines connected with the other terminal of said ferroelectric capacitor and intersecting with said word lines, a plurality of local bit lines connected with said cell transistors, and a global bit line that is selectively connected with local bit lines. Furthermore, the ferroelectric memory has a sensing amplifier unit that detects the amount of charging of the local bit lines from said memory cells while maintaining the potential of the local bit lines at a potential equivalent to the non-selected plate lines, during reading.

13 Claims, 15 Drawing Sheets

BLOCK DIAGRAM OF FIRST EMBODIMENT OF THE PRESENT INVENTION

Fig. 1 -- PRIOR ART --
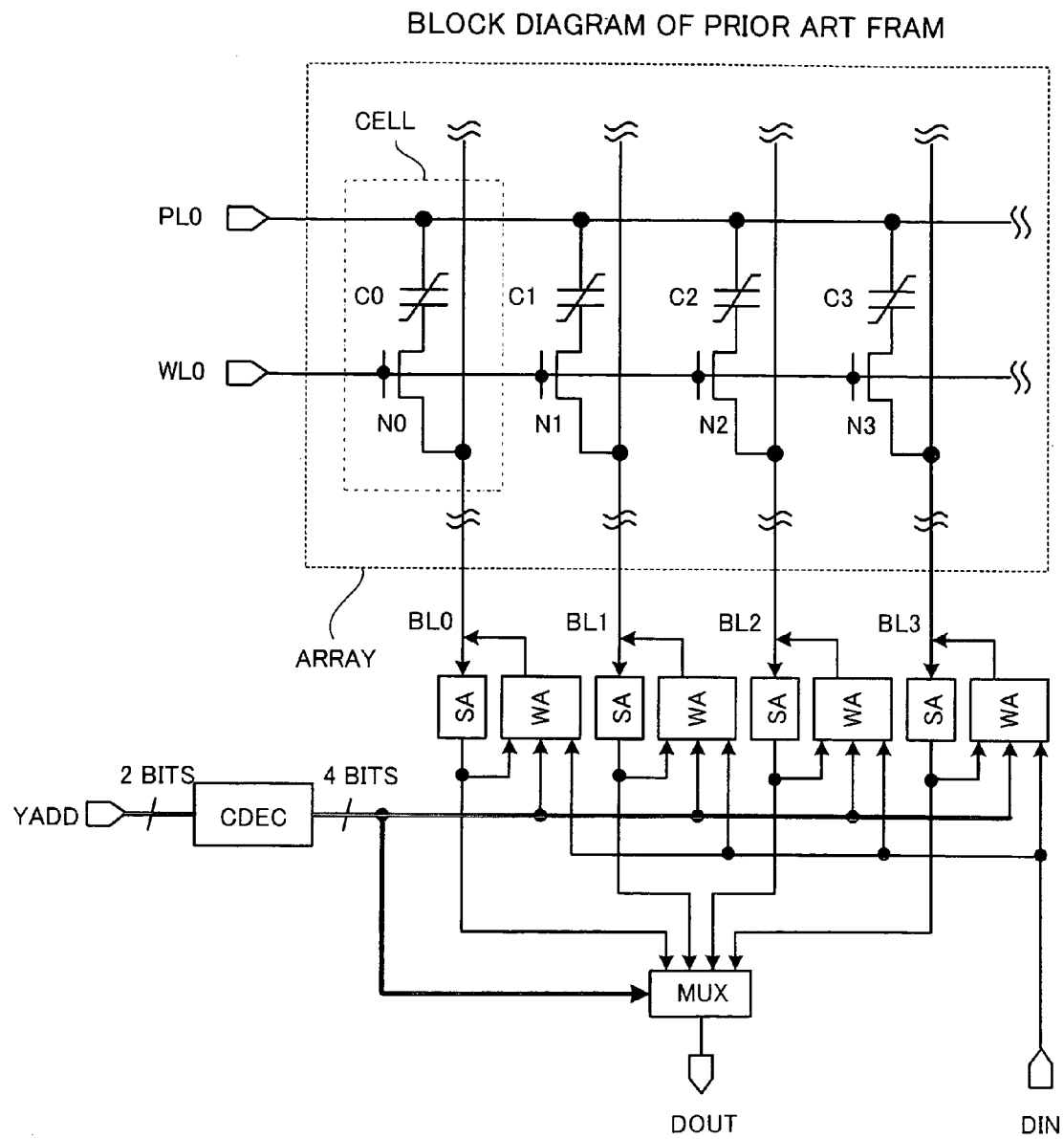

Fig. 2 -- PRIOR ART --
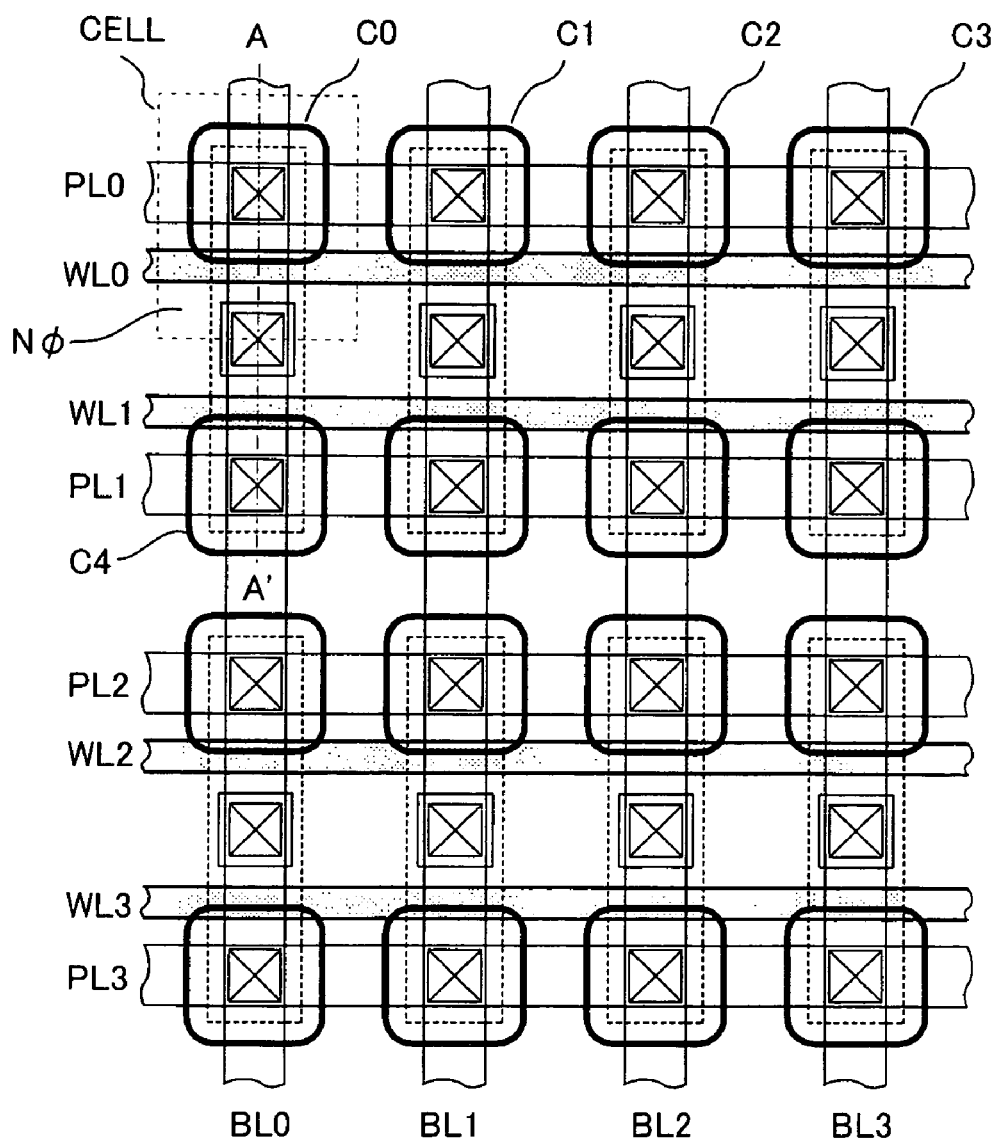
LAYOUT OF PRIOR ART FRAM MEMORY CELL

Fig. 3     -- PRIOR ART --
CROSS-SECTIONAL VIEW OF PRIOR ART FRAM MEMORY CELL
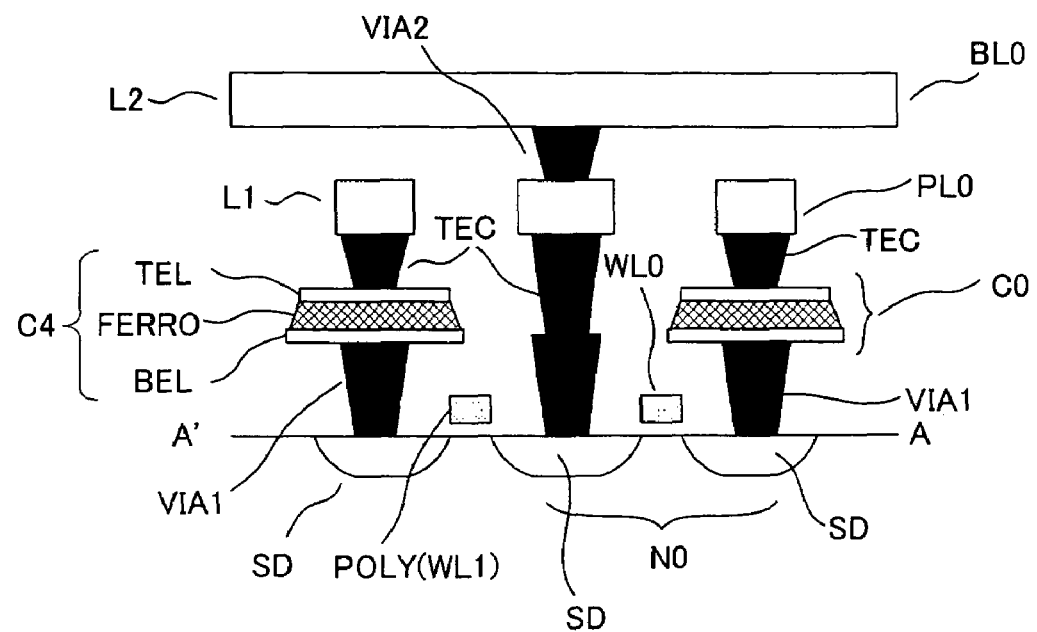

EXPLODED VIEW OF PRIOR ART LAYOUT

-- PRIOR ART --

-- PRIOR ART --

-- PRIOR ART --

-- PRIOR ART --

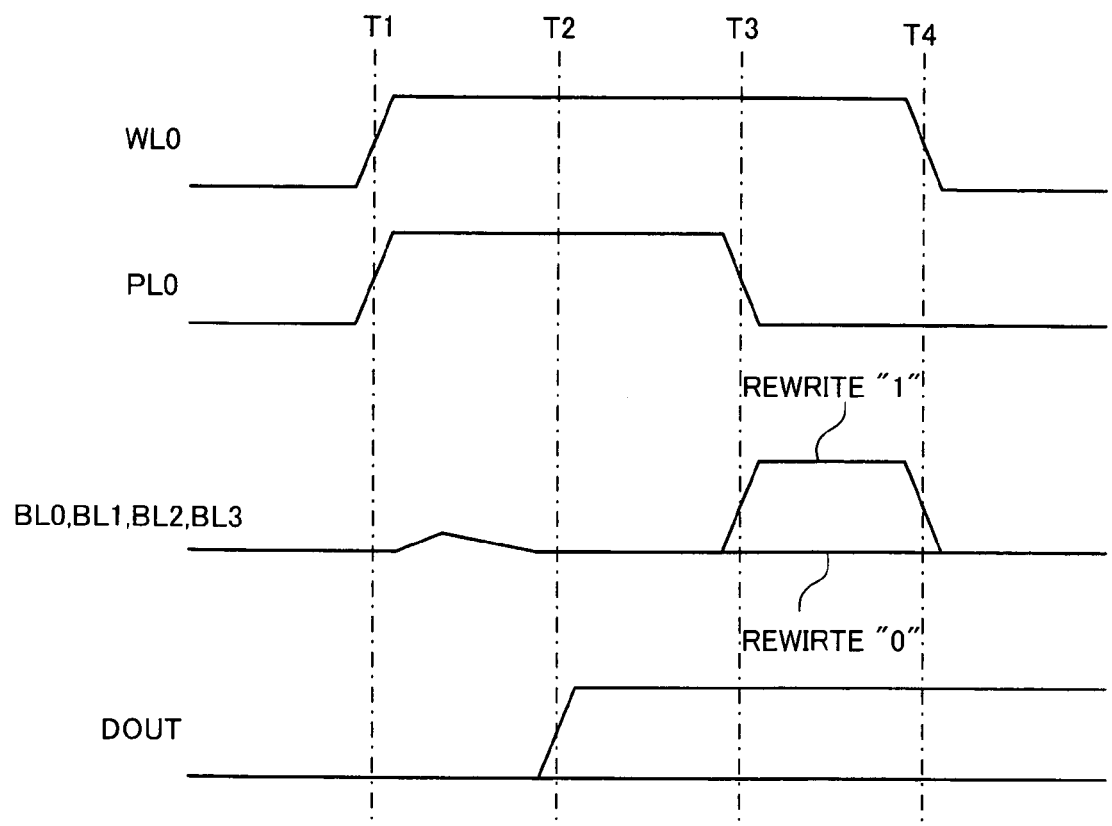
Fig. 5 -- PRIOR ART --
WAVEFORM DIAGRAM OF PRIOR ART FRAM

BLOCK DIAGRAM OF FIRST EMBODIMENT OF THE PRESENT INVENTION

LAYOUT OF FIRST EMBODIMENT OF THE PRESENT INVENTION

CROSS-SECTIONAL VIEW OF FIRST EMBODIMENT

EXPLODED VIEW OF LAYOUT OF FIRST EMBODIMENT

LAYOUT OF SECOND EMBODIMENT

CROSS-SECTIONAL VIEW OF SECOND EMBODIMENT

EXPLODED VIEW OF LAYOUT OF MEMORY CELL ARRAY OF SECOND EMBODIMENT

EXPLODED VIEW OF LAYOUT OF MEMORY CELL ARRAY OF SECOND EMBODIMENT

SEMICONDUCTOR MEMORY

BACKGROUND OF THE INVENTION

1. Field of the Invention

The present invention relates to a semiconductor memory and in particular relates to a semiconductor memory wherein the layout area of the memory cells in a non-volatile semiconductor memory utilizing ferroelectric capacitors is reduced and unnecessary rewriting when reading is eliminated.

2. Description of the Related Art

A ferroelectric memory (FRAM) using ferroelectric capacitors for the memory cells is capable of holding information in a condition in which the power source is turned off and is capable of high-speed reading comparable with SRAM, and reading and writing with low power consumption. Such memories are therefore widely employed in IC cards, storage media of game equipment and tag ICs.

In a ferroelectric memory, data is stored by utilizing the polarizing effect of the ferroelectric capacitor. For example, when writing, data "0" is written by polarizing in the positive direction by applying a positive voltage to the ferroelectric capacitor and data "1" is written by polarizing in the negative direction by applying a negative voltage. When reading, a positive voltage is applied to the ferroelectric capacitor. If the capacitor has data "0", its direction of polarization is not inverted; on the other hand, if the capacitor has data "1", its direction of polarization is inverted. Accompanying this process, the potential of the bit line is made high level or low level (high level in the case of data "1" but low level in the case of data "0") in accordance with the amount of charge that flows onto the bit line (a small amount of charge in the case of data "0" but a large amount of charge in the case of data "1"). In other words, in the reading operation, the presence of charge by polarization inversion is detected.

Since in the case of ferroelectric memory positive voltage is applied to the ferroelectric capacitor when reading, this process constitutes destructive reading. After reading has been performed, it is therefore necessary to rewrite this read data to the memory cells that have been read.

Ferroelectric memory may be of the 2 transistor/2 capacitor type, in which a memory cell comprises two transistors and two ferroelectric capacitors, or of the 1 transistor/1 capacitor type, in which a memory cell comprises one transistor and one ferroelectric capacitor. In the case of a 2 transistor/2 capacitor type, complementary data are recorded in the two capacitors and complementary signals are output to a bit line pair on reading, these complementary signals being detected by a sense amplifier. In the case of a 1 transistor/1 capacitor type, the data are recorded in a single capacitor and, on reading, high level or low level is output to the bit line and the sense amplifier detects the stored data by comparing the bit line level with a reference level that is generated by a reference memory cell. Although the circuit layout of the memory cells is simpler in the case of the 1 transistor/1 capacitor type, in the reading operation, it is necessary to perform a comparison with a reference level provided by a memory cell used for reference purposes.

Ferroelectric memories are described in for example Laid-open Japanese Patent Application No. 2002-133857 and Laid-open Japanese Patent Application No. 2003-197869 or IEEE JOURNAL OF SOLID-STATE CIRCUITS, VOL. 37, NO. 5, May 2002, "Bit line GND Sensing Technique for Low-voltage Operation FeRAM". These documents all disclose ferroelectric memories of the 1 transistor/1 capacitor type (1T1C). Since the memory cell construction is simpler in the case of 1T1C ferroelectric memories, this type is more suitable for large capacity memories. However, since the potential of the bit line rises during reading in accordance with the data of the memory cell, the voltage between the plate line and the bit line is decreased, causing the voltage applied to the ferroelectric capacitor to fall and so decreasing the amount of polarization charge that flows out. This lowers the potential difference of the bit line and so lowers the reading margin.

Laid-open Japanese Patent Application No. 2002-133857 and IEEE JOURNAL OF SOLID-STATE CIRCUITS, VOL. 37, No. 5, May 2002, "Bit line GND Sensing Technique for Low-voltage Operation FeRAM" disclose a detection circuit that holds the bit line potential at ground level when reading, in order to prevent this lowering of the reading margin. By maintaining the bit line potential at ground level, the full-swing power source voltage can be applied to the ferroelectric capacitor, thereby preventing a lowering of the amount of polarization charge.

Laid-open Japanese Patent Application No. 2003-197869 also proposes an optimum layout in a 1T1C ferroelectric memory.

SUMMARY OF THE INVENTION

For example in accordance with Laid-open Japanese Patent Application No. 2003-197869, a conventional ferroelectric memory structure comprises a polysilicon layer providing the word lines, an electrode layer for the plate lines that also serve as the electrodes for the ferroelectric capacitors, a first metallic layer that connects one of the source/drain of a cell transistor connected with the word line and another electrode of the ferroelectric capacitor, and a second metallic layer that provides the bit lines that intersect with the word lines and plate lines. Also in the layout of the memory cell via holes for contacts are respectively formed in the two source/drain regions of the cell transistor. A plurality of metallic layers are therefore required and processing becomes complicated. Also, the area of the memory cell is increased by the via holes for the contacts with the cell transistors.

Also, in a conventional ferroelectric memory, plate lines are provided parallel with the word lines and bit lines are provided intersecting with the word lines and plate lines. Consequently, when the selected word line is driven, the cell transistors of the non-selected memory cells also conduct, and polarization charge flows also onto the non-selected bit lines corresponding thereto. It is therefore necessary to provide a sense amplifier for all of the bit lines and to detect and rewrite the bit line potential for all of the memory cells associated with the selected word line. Thus wasteful rewriting is performed in respect of the non-selected memory cells and this results in wasted power consumption.

Accordingly, an object of the present invention is to provide a ferroelectric memory cell wherein the area occupied by the memory cells is reduced.

Furthermore, an object of the present invention is to provide a ferroelectric memory wherein manufacturing cost can be suppressed by simplifying the construction of the wiring of the memory cells.

Also an object of the present invention is to provide a ferroelectric memory wherein the data detection and rewriting operation for non-selected memory cells during reading is eliminated.

In view of the foregoing, according to an aspect of the present invention, a ferroelectric memory comprises a plurality of memory cells respectively having a cell transistor and ferroelectric capacitor whose one terminal is connected with the cell transistor, a plurality of word lines respectively connected with said cell transistor, a plurality of plate lines connected with the other terminal of said ferroelectric capacitor and intersecting with said word lines, a plurality of local bit lines connected with said cell transistors, and a global bit line that is selectively connected with local bit lines. Furthermore, the ferroelectric memory comprises a sense amplifier unit that detects the amount of charging of the local bit lines from said memory cells while maintaining the potential of the local bit lines at a potential equivalent to the non-selected plate lines, during reading.

With this aspect of the present invention, by driving the selected word line and driving the selected plate line, only the polarization charge of the selected memory cell at the position of intersection of the selected word line and the selected plate line flows out onto the local bit line so that the data of the selected memory cell is read by the sense amplifier unit. Thus, in the reading operation, application of voltage to the ferroelectric capacitors of the non-selected memory cells is avoided, so the polarized condition of the ferroelectric capacitors of the non-selected memory cells is not destroyed and it is therefore unnecessary to rewrite the non-selected memory cells.

In an aspect of the above invention, according to a preferred embodiment, when driving the local bit line for rewriting the selected memory cell, it is arranged for the non-selected plate lines to be driven in the same way, so that no potential difference is generated between the local bit line and non-selected plate lines. In this way, voltage to destroy the polarization condition is not applied to the ferroelectric capacitors of the non-selected memory cells that are connected with the local bit line. By drive control of the non-selected plate lines in this way, application of voltage to the ferroelectric capacitors of the non-selected memory cells that are connected with the selected word line is eliminated and destruction of the data stored in these can therefore be avoided.

In an aspect of the above invention, according to a preferred embodiment, the local bit line is arranged parallel with the word line and the local bit line is provided by a diffusion region connected in common with the source/drain regions of the plurality of cell transistors arranged in the word line direction, the global bit line is connected with the local bit line through a connecting circuit and this global bit line is arranged parallel with the plate line. With such an arrangement, the need to provide via holes for contact purposes in one of the source/drain regions of the cell transistors is eliminated and the area occupied by the cell transistors can therefore be greatly reduced. Also, it is unnecessary to provide a metallic wiring layer of the bit line in addition to the metallic wiring layer for the plate line, so the number of metallic wiring layers can thereby be reduced, lowering costs.

Furthermore, in the above preferred embodiment, a ferroelectric capacitor of stack type construction or a ferroelectric capacitor of planar type construction is provided in the other of the source/drain regions of the cell transistor. Separate connection of the ferroelectric capacitors within the memory cells with the respective cell transistors is necessary and contact via holes for achieving this connection become necessary. However, it is envisioned that future process improvements may render such contact via holes unnecessary.

In an aspect of the above invention, according to a preferred embodiment, the sense amplifier unit comprises a source follower transistor that is connected with the global bit line and whose gate/source voltage is controlled to about the threshold voltage, a polarization charge detection capacitor that resets the other terminal of this source follower transistor to negative voltage, and a sense amplifier that detects voltage change in response to the polarization charge amount that is input to the polarization charge detection capacitor from the memory cell. By providing such a sense amplifier unit, during reading operation, even though polarization charge flows out onto the local bit line from the selected memory cell, this is absorbed by the polarization charge detection capacitor, through the source follower transistor, so no rise in potential of the local bit line takes place and the local bit line is thus held at the same potential as the source potential of the non-selected memory cells (for example ground potential). Consequently, even though the non-selected memory cells are connected with the local bit line by driving of the selected word line, the local bit line potential is not elevated during reading operation and voltage is not applied to the ferroelectric capacitors of the non-selected memory cells: destruction of the polarization condition of the ferroelectric capacitors can thereby be prevented.

According to an aspect of the present invention, the construction of the memory cells can be simplified, making it possible to increase memory capacity and lower costs. Also, the sense amplifier operation and rewriting operation in respect of the non-selected memory cells can be eliminated.

BRIEF DESCRIPTION OF THE DRAWINGS

FIG. 1 is a block diagram of a prior art ferroelectric memory (FRAM);

FIG. 2 is a layout diagram of a memory cell array of a prior art ferroelectric memory;

FIG. 3 is a cross-sectional view of the portion A–A' of FIG. 2;

FIG. 5 is a waveform diagram of the reading operation of a prior art ferroelectric capacitor memory;

DESCRIPTION OF THE PREFERRED EMBODIMENTS

Figure 4A:
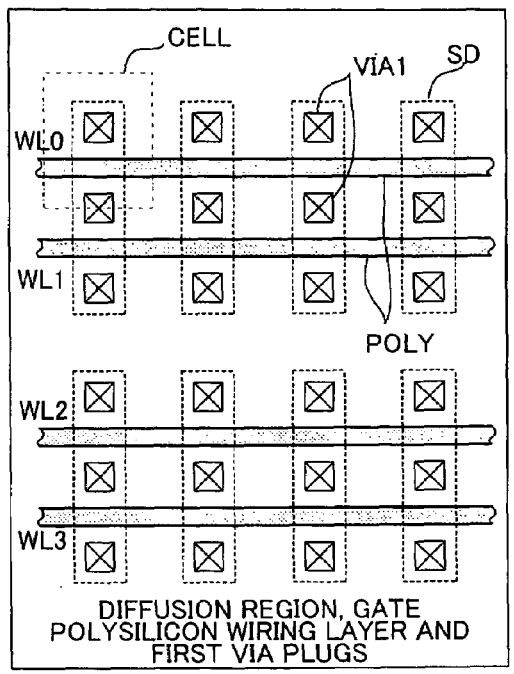
FIG. 4 is an exploded view of the sequence of process steps of the layout of a prior art ferroelectric memory.
Figure 4B:
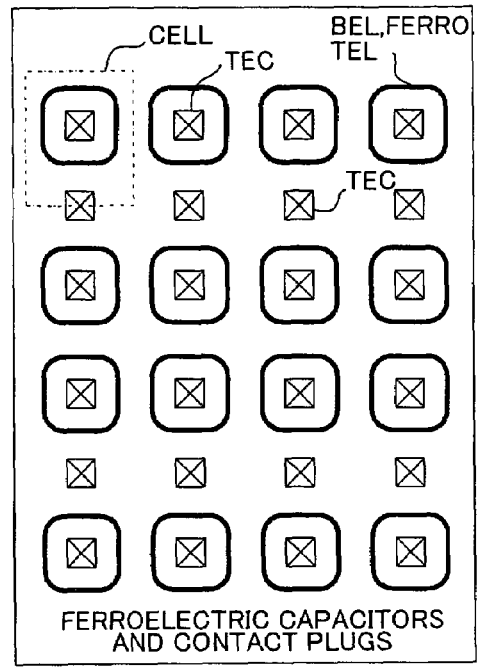
Figure 4C:
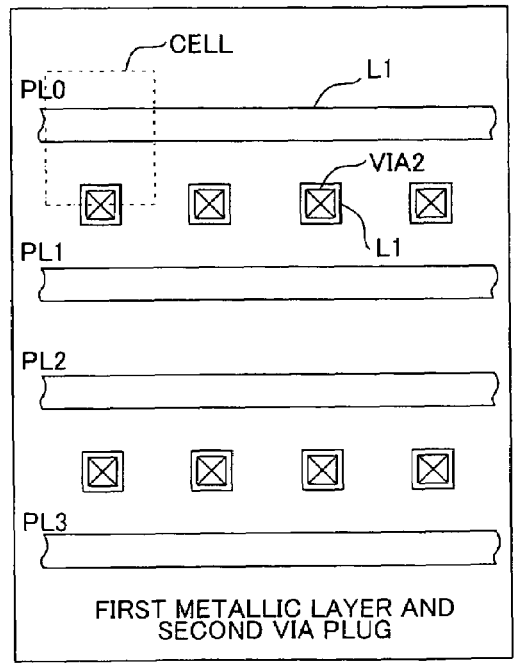
Figure 4D:
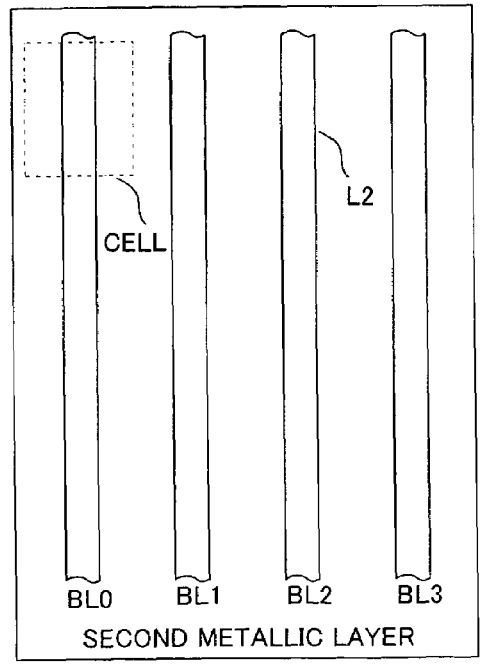

Embodiments of the present invention are described below with reference to the drawings. However, the technical scope of the present invention is not restricted to these embodiments and extends to the matters set out in the claims and equivalents thereof.

FIG. 1 is a block diagram of a prior art ferroelectric memory (FRAM). In FIG. 1, a memory cell CELL is a memory cell of the 1T1C (1 transistor/1 capacitor) type, comprising an N channel cell transistor N0 and a ferroelectric capacitor C0 connected therewith. One terminal of the ferroelectric capacitor C0 is connected with one of the source/drain of the cell transistor N0, while its other terminal is connected with the plate line PL0, respectively; the gate of the cell transistor N0 is connected with the word line WL0 and the other of the source/drain of the cell transistor N0 is connected with the bit line BL0, respectively. The other memory cells are likewise connected with the plate line PL0, word line WL0, and bit lines BL1, BL2 and BL3. Although in this case only four memory cells CELL are illustrated, in fact, a memory cell array ARRAY has a large number of memory cells in a matrix arrangement.

The bit lines BL0 to BL3 are respectively provided with a sense amplifier (read circuit) SA and a write amplifier (write circuit) WA. The X address, not shown, is decoded by a row decoder, not shown and is used to select a single word line WL0 and plate line PL0; the Y address YADD is decoded by a column decoder CDEC and is used to select a sense amplifier or write amplifier. The output of the sense amplifier SA is selected in accordance with the decoder output by the multiplexer MUX and is output to the outside as data output DOUT. Also, data input DIN that is supplied from the outside is supplied to the selected bit line through the write amplifier WA selected by the column decoder. Also, the output of the sense amplifier is input to the write amplifier WA and the corresponding bit lines are driven so that the memory cells are rewritten.

As described above, in the prior art ferroelectric memory, the word line and the plate line extend in parallel fashion in the row direction, and the bit lines extend in the column direction so as to intersect with the word and plate lines. Although the selected memory cells are selected by selection of the word line and selection of the bit line, the non-selected memory cells connected with the selected word line are also thereby connected with the bit line, accompanying the selection of the word line. The specific operation will be described in detail below.

FIG. 2 is a layout diagram of a memory cell array of a prior art ferroelectric memory. Only 16 memory cells CELL of part of the memory cell array are shown here. The word lines WL0 to WL3 comprise a gate polysilicon wiring layer and extend in the row direction (horizontal direction in the Figure). The plate lines PL0 to PL3 comprise a first metallic layer and extend in the row direction in the same way as the word lines. The bit lines BL0 to BL3 comprise a second metallic layer and extend in the column direction (vertical direction in the Figure). The plate lines PL0 to PL3 are constructed of a first metallic layer, the bit lines BL0 to BL3 are constructed of a second metallic layer, and both lines can mutually intersect. The construction of the memory cell array is described in detail with reference to the cross-sectional view and process layout view below.

FIG. 3 is a cross-sectional view of the portion A–A' of FIG. 2. A ferroelectric capacitor C0 is constituted by a bottom electrode BEL and top electrode TEL and a ferroelectric thin film FERRO sandwiched by these. An N channel cell transistor N0 is constituted by a source/drain diffusion region SD and a gate polysilicon wiring layer POLY (WL0). One of the source/drain SD of the cell transistor N0 is connected with the bottom electrode BEL of the ferroelectric capacitor C0 through a first via plug VIA1. The top electrode TEL of the ferroelectric capacitor C0 is connected with the plate line PL0, which is made of a first metallic layer L1, through a contact plug TEC. The construction whereby the ferroelectric capacitor C0 is formed on a via plug VIA1 in this way is termed a stack type construction. In contrast with the planar type of construction, described latter, in which the ferroelectric capacitor cannot be formed on the via plug VIA1, with the stack type of construction, the ferroelectric capacitor can be arranged in a stacked fashion on the drain of the cell transistor, therefore, area can be saved.

The other of the source/drain region SD of the N channel cell transistor N0 is shared with the adjacent cell transistor and is connected with the first metallic layer L1 through the first via plug VIA1 and contact plug TEC and, furthermore is connected with the bit line BL0 comprising the second metallic layer L2, through a second via plug VIA2.

Thus, all of the source/drain regions SD of the cell transistors are provided with first via plugs VIA1 as contact means. The via plugs and contact plugs are both vias for contact purposes made of metal embedded in the insulating film.

FIG. 4 is an exploded view of the sequence of processing steps of a prior art ferroelectric memory layout. In FIG. 4A, a source/drain diffusion region SD, a gate polysilicon wiring POLY that also serves as a word line WL and a first via plug VIA1 respectively provided on the source/drain diffusion region SD are formed. In FIG. 4B, bottom electrodes BEL and ferroelectric thin film FERRO and top electrodes TEL are formed, constituting the ferroelectric capacitors and, in addition, contact plugs TEC are respectively formed on the top electrodes TEL and first via plugs VIA1. In FIG. 4C, a first metallic layer L1 is formed, providing the plate line PL and, in addition, second via plugs VIA2 are formed on top of part of the first metallic layer L1. And in FIG. 4D a second metallic layer L2 is formed to provide the bit lines BL.

Writing of the ferroelectric memory consists in polarizing the ferroelectric capacitors by application of a positive or negative voltage and reading consists in detecting the presence or absence of a polarization inversion current when a positive voltage is applied to the ferroelectric capacitors. That is, in writing, the data is written by making the cell transistor conductive so as to apply a positive or negative voltage relatively between the bit line and plate line, thereby producing polarization by applying a positive or negative voltage to the ferroelectric capacitor. When data "0" is written, the plate line is made to be power source level VDD while the bit line is made to be ground level 0V (this is taken as positive voltage); when data "1" is written, the plate line is made ground level i.e. 0V and the bit line is made power source level VDD (this is taken as negative voltage). Even when the applied voltage is removed after writing, the polarization of the ferroelectric capacitor is retained i.e. the data becomes non-volatile.

In the case of reading, the bit line is reset to ground level and the cell transistor is made conductive, thereby driving the plate line with the power source level VDD. The bit line is maintained substantially at ground potential by employing a sense amplifier (described latter), for example as shown in Laid-open Japanese Patent Application No. 2002-133857 so that positive voltage is applied to the ferroelectric capacitor.

In this case, when data "0" is written to the ferroelectric capacitor, the voltage applied to the ferroelectric capacitor is of the same polarity as when the data was written, so no inversion of polarity takes place and comparatively little charge flows onto the bit line. In the case where data "1" is written to the ferroelectric capacitor, the voltage applied to the ferroelectric capacitor is of the opposite polarity to that which was written, so polarization inversion takes place and a large inversion charge flows to the bit line. The sense amplifier senses the amount of this polarization charge, converts it to voltage and outputs this as read data DOUT.

Also, in reading of the ferroelectric memory, the plate line is raised to the power source level VDD while the bit line is held substantially at ground potential, so a voltage which is substantially the same as in the case of the operation of writing data "0" is applied to the ferroelectric capacitor i.e. destructive reading takes place in respect of a memory cell that holds data "1". Consequently, it is necessary to rewrite the data "1" to a memory cell holding data "1" after reading. In the case of a memory cell holding data "0", the reading operation also serves for rewriting.

FIG. 5 is a waveform diagram of the reading operation of a prior art ferroelectric capacitor memory. The operation of reading a conventional ferroelectric memory is described with reference to this Figure. Let us now assume that the plate line PL0 and word line WL0 are selected. Also, let us assume that the decoder CDEC and multiplexer MUX select the bit line BL0 in accordance with the address signal YADD. When, at the time T1 in FIG. 5, voltage rises on the word line WL0 and plate line PL0, the current that is produced by the polarization charge in accordance with the data held by the ferroelectric capacitor C0 of the memory cell CELL flows onto the bit line BL0. At the time T2, the sense amplifier SA senses this and thereby performs reading through the multiplexer MUX and outputs this as data DOUT. By means of the sense amplifier described latter, the bit line potential is held substantially at ground potential, albeit there is a slight rise, even during reading. The bit line potential is therefore entirely at ground potential at the time T2.

Since the plate line is at power source level VDD and the bit line is at ground level, when the read data is "0", "0" rewriting operation is performed until the plate line PL0 falls at the time T3. After the time T3, the plate line PL0 and the bit line BL0 are both maintained at ground level. In contrast, when the read data is "1", at time T3, the plate line PL0 falls in potential and the write amplifier WA raises the bit line BL0 to the power source level VDD by inputting the data "1", which is the read data of the sense amplifier. The operation of rewriting data "1" to the memory cell is thereby performed by the plate line PL0 becoming ground level and the bit line BL0 becoming power source level VDD. Finally, at time T4, the read operation is terminated by fall in potential of the word line WL0 and bit line BL0.

Since, in the case of the non-selected memory cells of the bit lines BL1 to BL3 which are not selected, the plate line PL0 and word line WL0 are also selected, reading by the sense amplifier and rewriting by the write amplifier are performed in the same way as in the case of the selected bit line BL0. However, these data are not selected by the multiplexer MUX and so are not output to the outside.

In the operation of writing to the memory cells CELL connected with the bit line BL0, the write data DIN is written instead of the rewrite data in the reading operation. Otherwise, the operation is the same as in the case of the reading operation. Specifically, in the case where the write data DIN is "0", the reading operation of the time T1 to T3 indicated in FIG. 5 becomes the writing operation and, if the write data DIN is data "1", the operation of writing (rewriting) of data "1" in the time T3 to T4 becomes the writing operation. If the write data DIN is data "0", the plate line PL0 and bit line BL0 are both maintained at ground level without performing the operation of writing data "1". In the case of the non-selected memory cells connected with the selected word line, reading and rewriting are performed in the same way as in the case of the reading operation described above, in the writing operation also.

As shown in FIGS. 2, 3 and 4, in the ferroelectric memory of the prior art example, a first via plug VIA1 is provided for contact purposes in the source/drain region SD on both sides of the cell transistor, so the area of the memory cell becomes large. Also, since the plate line and bit line constructed of metallic layers such as aluminum intersect, two metallic layers are required for these and the construction therefore becomes complicated. Also, the cell transistors of the non-selected memory cells conduct when the word line is driven and the polarized condition of the ferroelectric capacitor of these is thus destroyed, so reading by the sense amplifier and rewrite by the write amplifier must be performed in respect of these non-selected memory cells, increasing power consumption.

Embodiments

Figure 6:
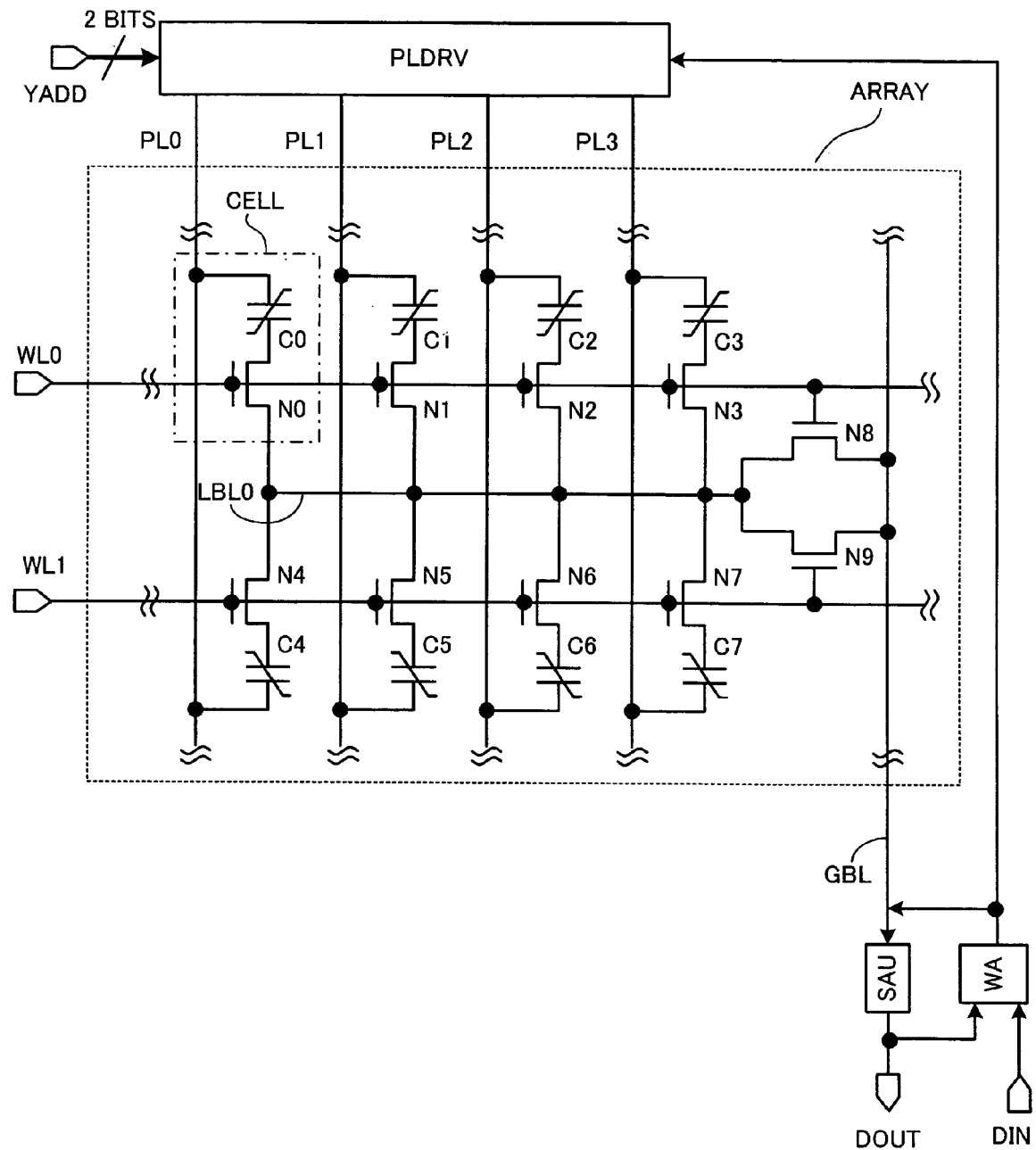
FIG. 6 is a circuit diagram of a ferroelectric memory according to a first embodiment.

FIG. 6 is a circuit diagram of a ferroelectric memory according to a first embodiment. Structural elements that are the same as in the prior art example are given the same reference symbols below. In FIG. 6, a memory cell CELL is a 1T1C (1 transistor/1 capacitor) type memory cell, as in the prior art example and comprises an N channel cell transistor N0 and ferroelectric capacitor C0. A total of eight memory cells CELL are arranged in two rows and four columns in FIG. 6. These memory cells are likewise constructed of cell transistors N1 to N7 and ferroelectric capacitors C1 to C7.

A characteristic feature of this memory cell array ARRAY is that, although the word lines WL0, WL1 extend in the row direction, the plate lines PL0 to PL3 extend in the column direction, intersecting orthogonally with the word lines. Also, local bit lines LBL are arranged parallel with the word line and one of the source/drain of the cell transistors N0 to N7 of the memory cells in the two rows thereabove and therebelow is connected with one of the local bit lines, LBL0. The local bit line LBL0 is then connected with the global bit line GBL through N channel transistors N8, N9 constituting connection means. The global bit line GBL extends in the column direction parallel with the plate line PL. The gates of the transistors N8, N9 constituting connection means are connected with the respective word lines WL0, WL1 and the local bit line LBL0 associated with the selected word line is thereby connected with the global bit line GBL.

The four memory cells comprising the ferroelectric capacitors C0 to C3 and the cell transistors N0 to N3 are respectively connected with the word line WL0 and plate lines PL0 to PL3. Also, the four memory cells comprising the ferroelectric capacitors C4 to C7 and cell transistors N4 to N7 are likewise respectively connected with the word line WL1 and plate lines PL0 to PL3. Also, the source/drain of the cell transistors N0 to N7 are connected in common with the local bit line LBL0. In this case, for simplicity, the case where eight memory cells are connected with the local bit line LBL0 is illustrated, but, in fact, a large number of memory cells such as for example 16 or 32 is connected therewith. Although not shown, in fact there are a large number of word lines and global bit lines and the memory cell array ARRAY comprises a large number of memory cells.

Thus, when the selected word line is driven, the cell transistors conduct and the local bit lines corresponding to the selected word lines are connected with the global bit line by the connection means N8, N9. Consequently, a large number of local bit lines are selectively connected with a single global bit line. Also, a plurality of global bit lines are selected by the Y address by being connected with for example a multiplexer, not shown.

In this embodiment, a sense amplifier unit SAU and write amplifier WA are provided on the global bit line GBL. The output of the sense amplifier unit SAU is output to the outside as output data DOUT and is simultaneously fed back to the write amplifier WA. The write amplifier WA also inputs input data DIN from outside and the output of the sense amplifier unit SAU and the input data DIN are switched according to a write control signal, not shown. The output of the write amplifier WA is fed back to the global bit line GBL and also is applied to a plate line drive circuit PLDRV. During rewriting, the plate line drive circuit PLDRV prevents destruction of the polarization condition of the ferroelectric capacitors of the non-selected memory cells by controlling drive of the non-selected plate lines in accordance with the output level of the write amplifier WA. Also, the plate line drive circuit PLDRV drives the plate line corresponding to the selected memory cell in accordance with the Y address YADD.

Figure 7:
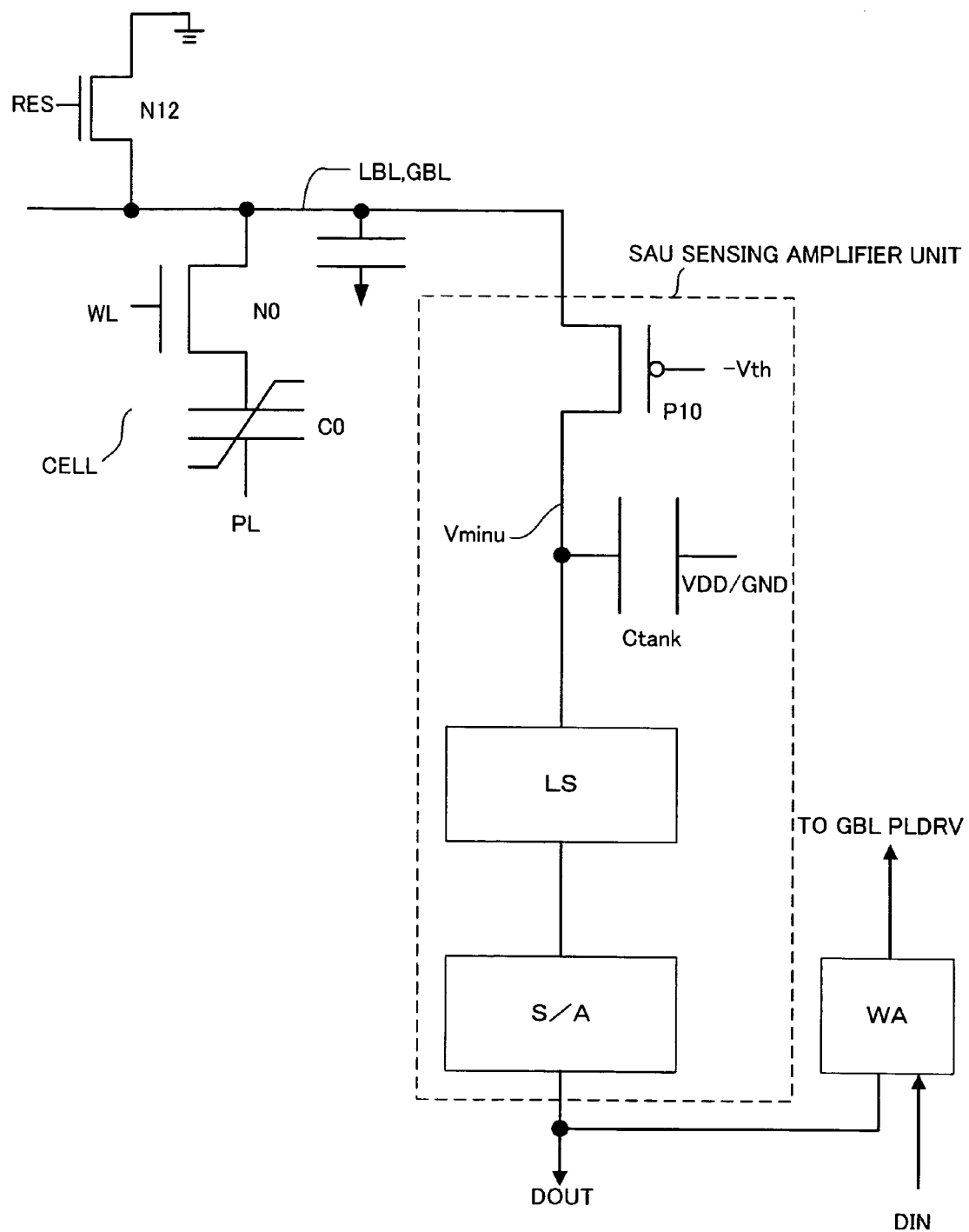
FIG. 7 is a circuit diagram of a sense amplifier unit according to this embodiment.

FIG. 7 is a circuit diagram of a sense amplifier unit according to this embodiment. In FIG. 7, a memory cell CELL and local bit line LBL and global bit line GBL are shown. The sense amplifier unit SAU comprises a P channel source follower transistor P10 whose gate is maintained at the negative threshold voltage, a load detection capacitor Ctank that absorbs the charge flowing in through the source follower transistor P10 by lowering the node Vminus of the source follower transistor P10 to negative potential, a level shift circuit LS that shifts the negative potential level of the node Vminus to a positive potential, and a sense amplifier S/A that detects the potential change of the level shift. Also, a reset transistor N12 that resets the bit line to ground level is provided on the bit line. The operation of this sense amplifier unit circuit is described in the following description of the reading operation.

Figure 8:
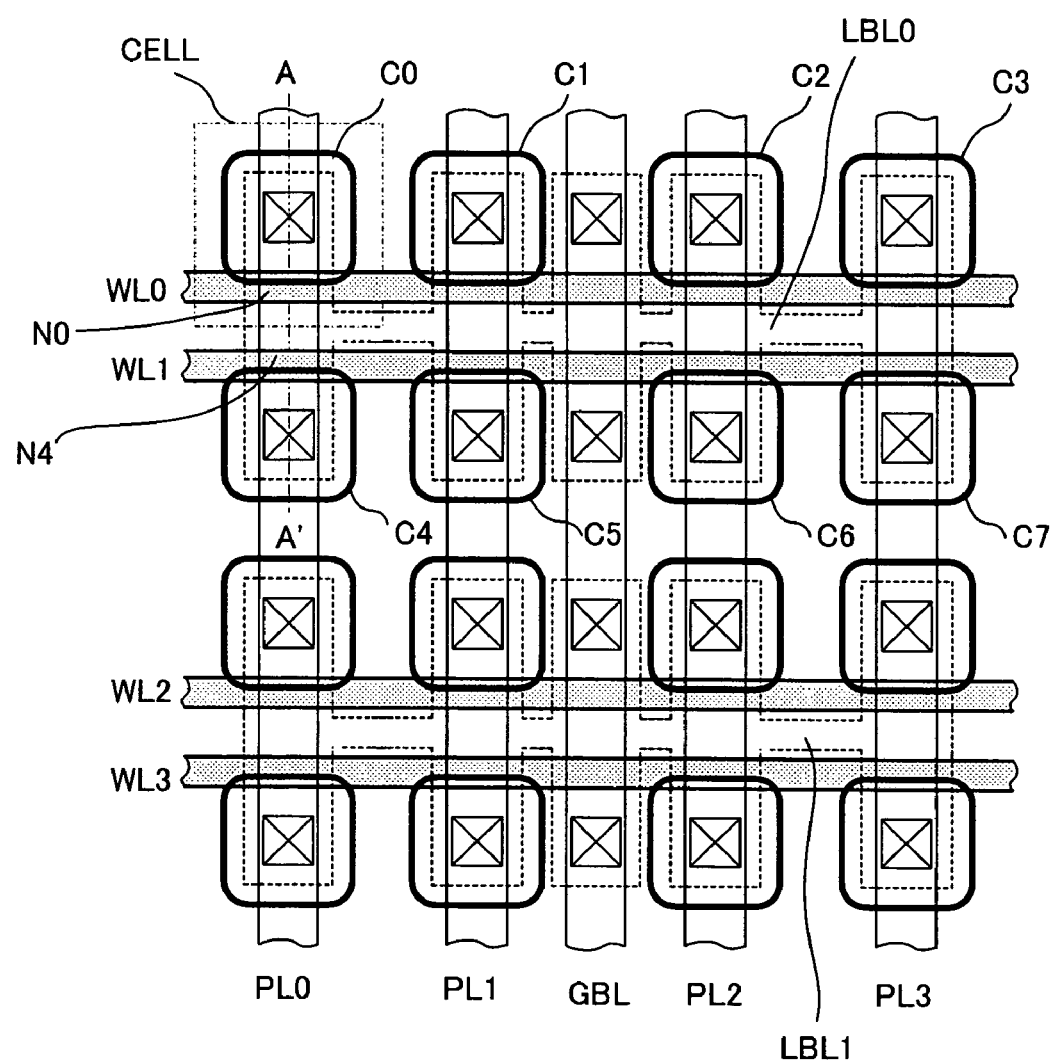
FIG. 8 is a layout diagram of a cell array according to the first embodiment.

FIG. 8 is a cell array layout diagram of the first embodiment. In FIG. 8, 16 memory cells constituting part of the memory cell array are shown. In this Figure, memory cells CELL, ferroelectric capacitors C0 to C7 and other 8 ferroelectric capacitors, plate lines PL0 to PL3, word lines WL0 to WL3 and global bit lines GBL are shown. The word lines WL0 to WL3 are provided by a gate polysilicon wiring layer and extend in the row direction. The local bit lines LBL0, LBL1 are provided by source/drain regions extending in the row direction parallel with the word line. Since the plate lines PL0 to PL3 are made of the first metallic layer and extend in the column direction, while the global bit line GBL also extends in the column direction, this may be formed by the first metallic layer, like the plate lines.

Figure 9:
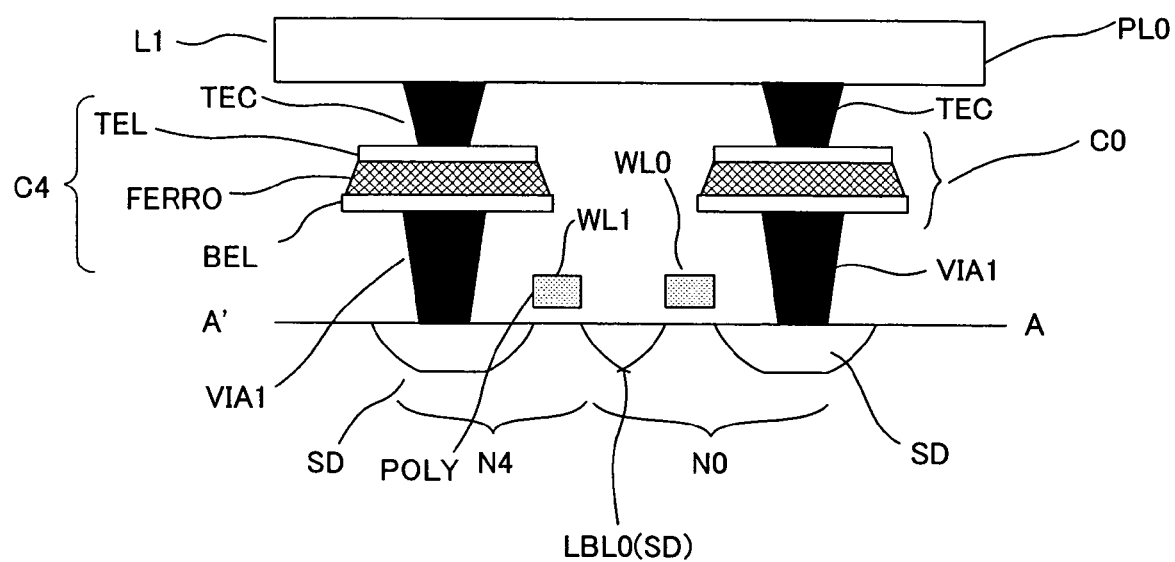
FIG. 9 is a cross-sectional view showing the cross section of the portion A–A' of FIG. 8.

FIG. 9 is a cross-sectional view showing a cross section of the portion A–A' of FIG. 8. In the same way as in the prior art example, the ferroelectric capacitor C0 is constituted by a bottom electrode BEL and upper electrode TEL and a ferroelectric thin film FERRO sandwiched between these. The cell transistors N0, N4 are constituted by source/drain diffusion region SD and gate polysilicon wiring layer POLY. One of the source/drain regions SD of the cell transistors N0, N4 is connected with the bottom electrodes BEL of the ferroelectric capacitors C0 and C4 through the first via plug VIA1. Also, the top electrodes TEL of the capacitors C0, C4 are connected with the plate line PL0 made of the first metallic layer L1 through the contact plug TEC. That is, just as in the case of the prior art example, this embodiment is a stack type construction in which the ferroelectric capacitors C0, C4 are arranged in stacked fashion on the via plug VIA1 of the cell transistor drain SD.

However, a characteristic feature is that the other source/drain diffusion region SD of the cell transistor N0 is shared with the cell transistor N4 that is adjacent thereto on the left and is also shared with the cell transistors N1 to N3, N5 to N7 of the other six memory cells that are arranged in the perpendicular direction to the plane of the Figure, this shared source/drain region SD thereby constituting a local bit line LBL0. That is, in the layout diagram of FIG. 8, the local bit lines LBL0, LBL1 extend in the row direction parallel with the word lines WL0 to WL3. However, no first via plug VIA1 for contact purposes is provided on this shared source/drain region LBL0 (SD). The area of the memory cell CELL is therefore reduced. In addition, the plate lines PL and global bit line GBL are formed by the metallic wiring layer L1, thereby reducing the number of metallic wiring layers.

Figure 10A:
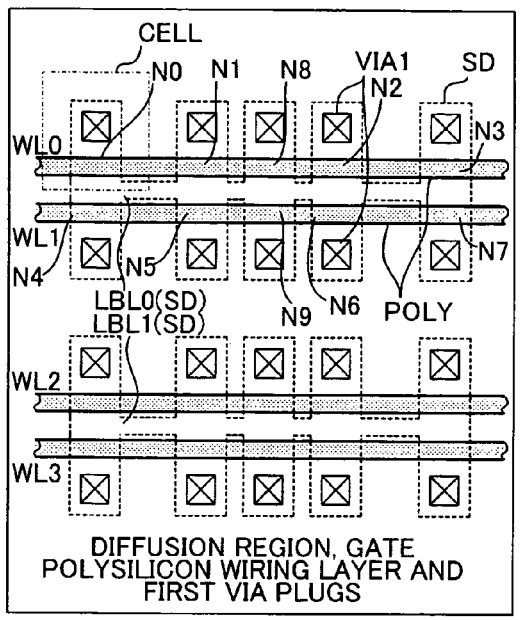
FIG. 10 is an exploded view of the sequence of processing steps of the layout of a memory cell array according to the first embodiment of the present invention.
Figure 10B:
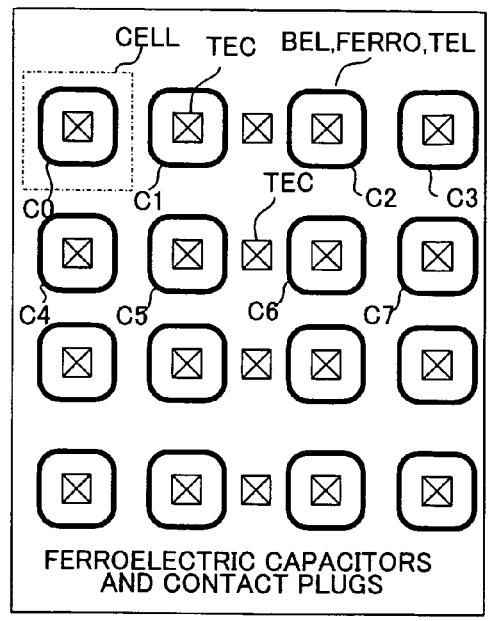
Figure 10C:
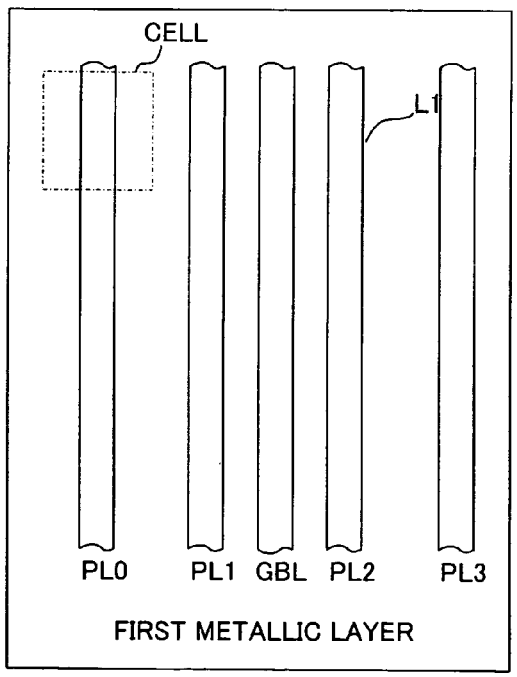

FIG. 10 is an exploded view of the sequence of processing steps of the layout of the memory cell array in the first embodiment. In FIG. 10A, a source/drain diffusion region SD, a gate polysilicon wiring POLY providing the word lines, and a first via plug VIA1 for contact purposes are formed. In FIG. 10B, a bottom electrode BEL formed on the first via plug VIA1 and a ferroelectric thin film FERRO and top electrode TEL are formed. The ferroelectric capacitor shown in FIG. 9 is thereby formed. In addition, the contact plug TEC is formed on top of the top electrode TEL and first via plug VIA1. Also, in FIG. 10C, a first metallic layer L1 providing the bit lines PL0 to PL3 and global bit line GBL is formed. Compared with the prior art example shown in FIG. 4, the second metallic layer is eliminated.

In the first embodiment, as shown in FIG. 10A, the local bit lines BL0, BL1 extend in the row direction parallel to the word lines WL0 to WL3 and are provided by the source/drain region SD of the cell transistor N0 of the memory cell CELL. That is, the local bit line LBL0 is provided by the source/drain region SD that is common to the cell transistors N0 to N7. Likewise, the local bit line LBL1 is provided by the source/drain region SD that is common to the cell transistors of the word lines WL2, WL3. Consequently, the first via plug for connecting with the bit line becomes unnecessary in the source/drain region SD of the cell transistors therefore the dimension in the vertical direction of the memory cell CELL can be reduced compared with the prior art example (see FIG. 4A). The dimension in the horizontal direction becomes longer due to the transistors N8, N9 provided for connection with the global bit line GBL, but if the increase by the connection transistors can be low by increasing the number of memory cells per bit line of the local bit lines LBL0, LBL1. In this way, the benefit of reduction of area due to shrinkage in the vertical direction becomes dominant. Also, the increase in area produced by the connection transistors can be mitigated by arranging the global bit line GBL on top of the connection transistors N8, N9. Furthermore, since the global bit line GBL is arranged parallel with the plate lines PL0 to PL3, only a single metallic layer L1 need be provided for this purpose, thereby reducing the number of metallic layers of the chip and so enabling manufacturing costs to be reduced or enabling the upper metallic wiring to be employed for other signals or power sources, thereby enabling more effective utilization of the area.

Figure 11:
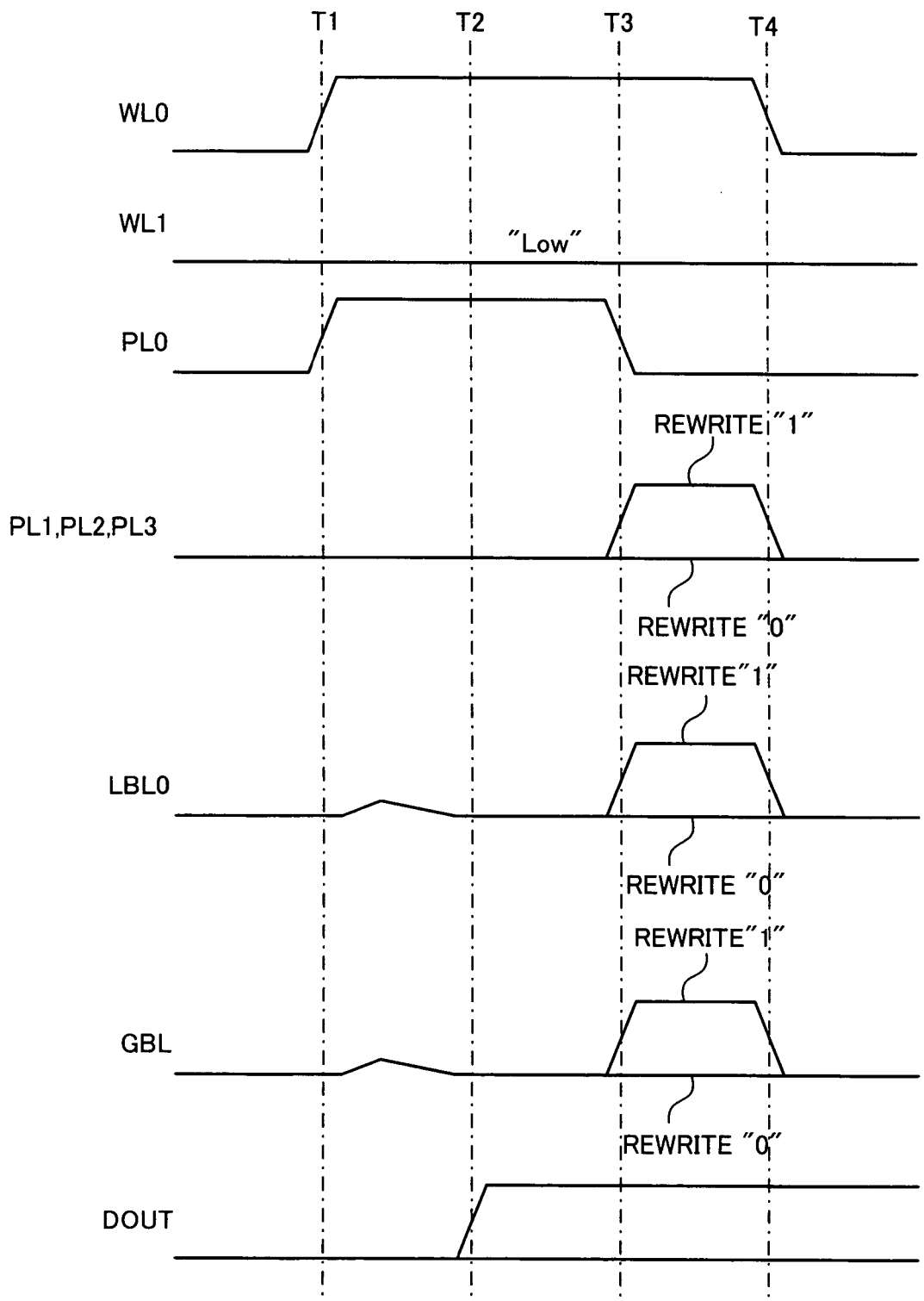
FIG. 11 is a waveform diagram of the reading operation according to the first embodiment.

FIG. 11 is a waveform diagram of the reading operation in the first embodiment. Just as in the case of the prior art, the case where power source level VDD is applied to the plate line and ground level (0V) is applied to the bit line is termed positive voltage and this is taken as the write voltage for data "0". Conversely, the case where ground level (0V) is applied to the plate line and power source level VDD is applied to the bit line is termed negative voltage and this is taken as the write voltage of data "1". Even when the write voltage is removed after writing, the polarization of the ferroelectric capacitor is retained i.e. the data becomes non-volatile.

The operation of reading the ferroelectric memory in the first embodiment will be described with reference to FIG. 6, FIG. 7 and FIG. 11. It will now be assumed that a memory cell having a cell transistor N0 and ferroelectric capacitor C0 is selected. In this case, the word driver, not shown, selects the word line WL0 and the plate driver PLDRV selects the plate line PL0 corresponding to the address signal YADD. First of all, at the time T1 of FIG. 11, the word line WL0 and plate line PL0 are driven to H level (power source level). The non-selected word line WL1 and plate lines PL1 to PL3 remain at L level (ground level). By rise of the word line WL0, the cell transistors N0 to N3 and connecting transistor N8 that are connected therewith become conductive. The global bit line GBL is held at GND potential by the sense amplifier SA and the local bit line LBL0 that is connected therewith through the connecting transistor N8 is reset to ground potential by a reset transistor N12.

When the local bit line LBL0 is at ground potential, the cell transistor N0 conducts and the plate line PL0 rises, so positive voltage is applied to the ferroelectric capacitor C0 of the memory cell CELL. As a result, the current produced by the polarization charge in accordance with this held data flows onto the local bit line LBL0 from the ferroelectric capacitor C0 through the cell transistor N0 and further flows onto the global bit line GBL through the connecting transistor N8. The sense amplifier unit SAU detects the amount of this current and outputs this as the read data DOUT at the time T2.

The gate of the source follower transistor P10 is controlled to the negative threshold voltage −Vth by the sense amplifier unit SAU shown in FIG. 7 and one electrode of the polarization charge detection capacitor Ctank is driven from the power source level VDD to the ground level GND; the node Vminus is thereby reset to negative potential. In this condition, when the polarization charge flows onto the local bit line LBL and the global bit line GBL, these bit line potentials temporarily rise, but, accompanying this rise, the source follower transistor P10 conducts, with the result that the polarization charge flowing into the bit lines is absorbed. The absorbed polarization charge is absorbed by the polarization charge detection capacitor Ctank, raising the potential of the node Vminus. This rise in voltage is transmitted to the sense amplifier S/A as a positive voltage potential rise by the level shift circuit LS.

In this way, although the potentials of the bit lines GBL and LBL0 rise slightly, they are maintained at substantially ground potential by the sense amplifier unit SAU during the reading operation also. Furthermore, the non-selected plate lines PL1 to PL3 are also L level (ground potential). Therefore, even though the cell transistors N1 to N3 of the non-selected memory cells are in conductive condition, no voltage can thus be applied to their ferroelectric capacitors C1 to C3. Consequently, the polarization current from the non-selected memory cells does not flow onto the bit lines and, in addition, there is no possibility of the data which they hold being destroyed, the plate lines PL1–PL3 does not have to be driven so. Also, the remaining word line WL1 remains at L level and the cell transistors N4 to N7 and connecting transistor N9 remain non-conductive. Consequently, read voltage is not applied to their ferroelectric capacitors C4 to C7, so there is no possibility of their held data being destroyed.

Since the selected plate line PL0 is H level (power source level VDD) and the local bit line LBL0 is ground level, if the read data of the ferroelectric capacitor C0 of the selected memory cell is "0", a rewriting operation of the data "0" is performed until the plate line PL0 drops at the time T3. In this case, after the time T3, the plate line PL0 and local bit line LBL0 are both held at ground level. If the read data was "1", the plate line PL0 drops at time T3 and "1", which is the read data of the sense amplifier unit, is input by the write amplifier WA, with the result that H level is output. The global bit line GBL is thereby driven to H level (power source level VDD) and rewriting of the data "1" to the selected memory cell is performed. Simultaneously, in response to the H level output of the write amplifier WA, the plate line driver PLDRV drives the non-selected plate lines PL1 to PL3 to H level (power source level VDD). The gate of the source follower transistor P10 of the sense amplifier unit SAU is then controlled to H level, so that this transistor P10 is put in non-conductive condition.

That is, by the rise of the global bit line GBL to the H level power source level VDD, the local bit line LBL0 is also raised to the H level power source level VDD. Due to the L level (ground level) of this selected plate line PL0 and the H level VDD of the local bit line LBL0, negative voltage is applied to the ferroelectric capacitor C0 of the selected memory cell and rewriting of data "1" is thereby performed. At this point, the non-selected plate lines PL1 to L3 are driven to H level VDD, so although the local bit line LBL0 is driven to H level VDD for rewriting and the cell transistors N1 to N3 are in conductive condition, no rewriting voltage is applied to the ferroelectric capacitors C1 to C3 of the non-selected memory cells, so there is no possibility of the data which they hold being destroyed.

Also, since the non-selected word line WL1 is L level, the cell transistors N4 to N7 that are connected therewith and the connecting transistor N9 remain in non-conducting condition. Consequently, no rewriting voltage is applied to their ferroelectric capacitors C4 to C7 and the data which they hold cannot be destroyed by being overwritten. Finally, at the time T4, the word line WL0, plate lines PL1 to PL3 and global bit line GBL drop, and reading is thereby terminated. The local bit line LBL0 becomes floating, but all of the cell transistors are non-conductive, so this does not present a problem.

Apart from the writing of the write data DIN instead of the rewrite data in the above reading operation, the writing operation of the memory cell CELL is the same as the above reading operation. Specifically, in the case where the input data DIN is "0", the reading operation during the time T1 to T3 becomes a writing operation and in the case where the input data DIN is "1", a writing operation is performed that is the same as the rewriting operation of the data "1" in the period T3 to T4. A writing operation of this data "1" is not performed if the input data DIN is "0".

As described above, in the first embodiment, the bit lines are remodeled as local bit lines and a global bit line, thereby making it possible to select only a single memory cell by using the intersecting word lines and plate lines. Consequently, only a single set of a sense amplifier unit and write amplifier is required for a plurality of memory cells that are respectively connected with a plurality of local bit lines, and it becomes possible to avoid wasteful reading and rewriting of the non-selected memory cells, thereby achieving a saving of power. Of course, the non-selected plate lines need to be driven in accordance with the rewrite data, so power is consumed to that extent, but, by optimizing the layout of the cell array, the effect of power saving achieved by the sense amplifier units can be made predominant.

Second Embodiment

Figure 12:
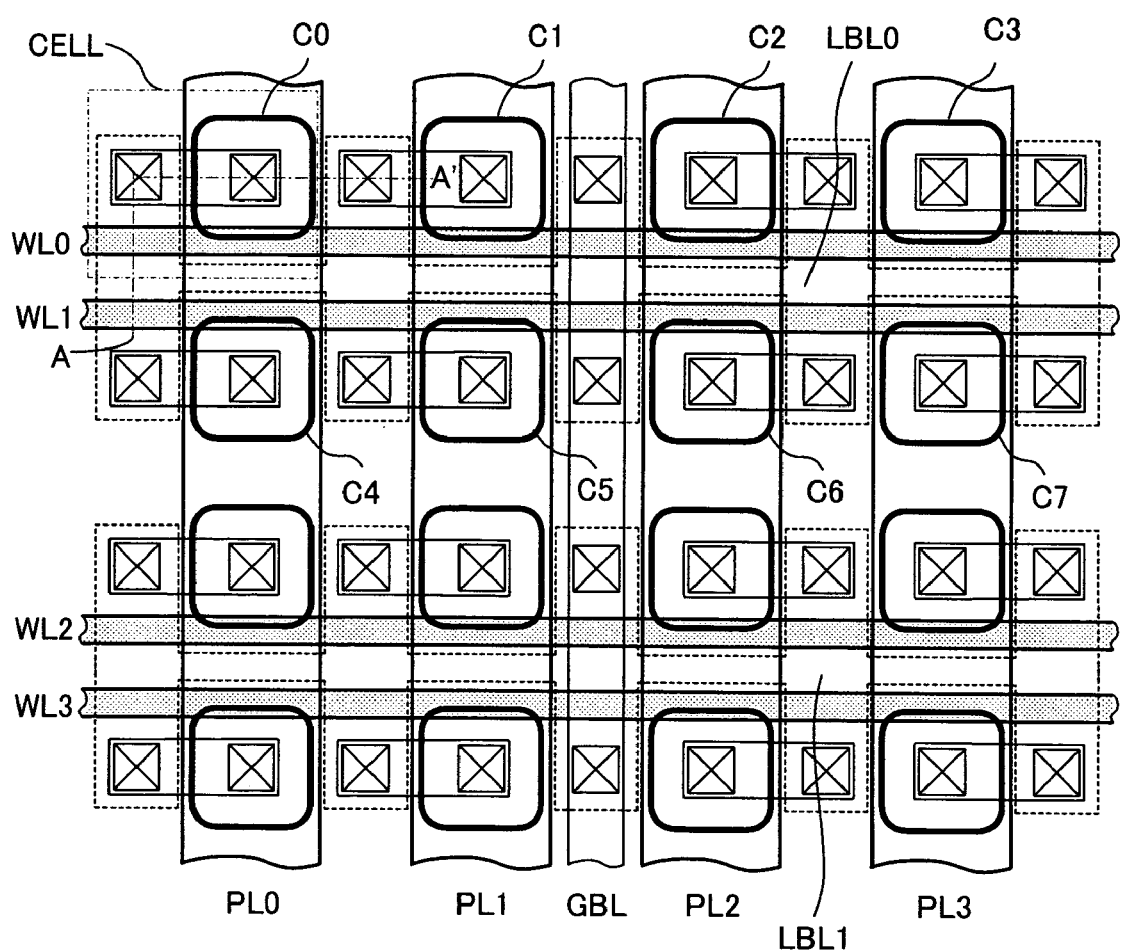
FIG. 12 is a layout diagram of the memory cell array according to a second embodiment.

FIG. 12 is a layout diagram of a memory array according to a second embodiment. In the second embodiment, the ferroelectric capacitors are made of the planar type. In this respect it differs from the first embodiment, but the circuitry and operation thereof are the same as in the case of the first embodiment. FIG. 12 shows only 16 memory cells CELL constituting part of a memory cell array. Ferroelectric capacitors C0 to C7 and other 8 Ferroelectric capacitors, plate lines PL0 to PL3, word lines WL0 to WL3, local bit lines LBL0, LBL1 and global bit line GBL are arranged just as in the case of the first embodiment. The word lines WL0 to WL3 are provided by the gate polysilicon wiring layer and extend in the row direction. The local bit lines LBL0, LBL1 are provided by the common source/drain region of the cell transistors and extend in the row direction parallel to the word lines. Also, the plate lines PL0 to PL3 are constituted of the bottom electrodes BEL of the ferroelectric capacitors and extend in the column direction. The global bit line GBL is provided by the first metallic layer and extends in the column direction.

Figure 13:
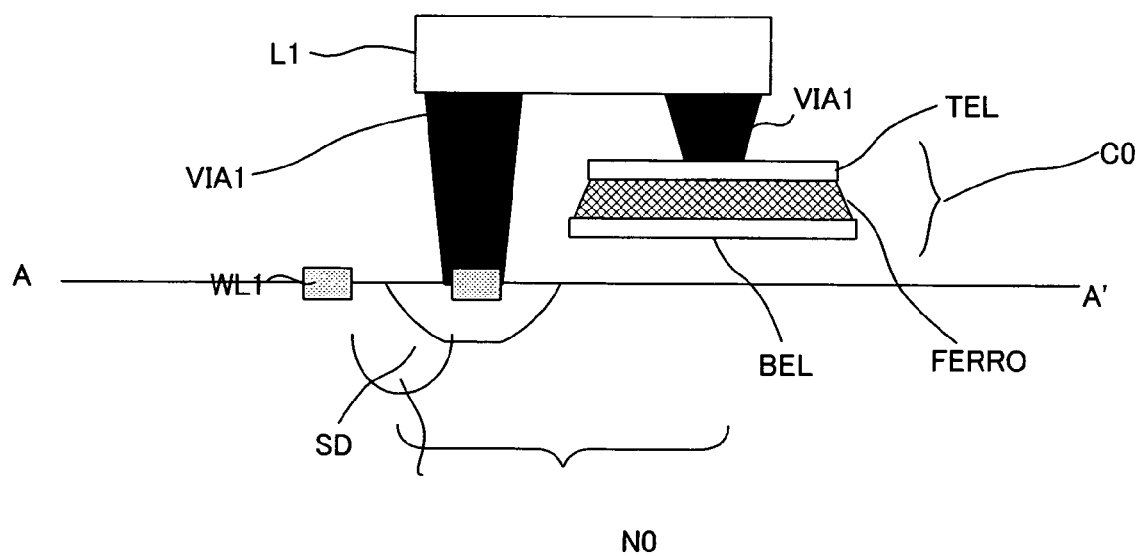
FIG. 13 is a cross-sectional view showing a cross-section of the portion A–A' of FIG. 12.

FIG. 13 is a cross-sectional view showing a cross-section of the portion A–A' of FIG. 12. The memory cells are of the planar type construction, so the ferroelectric capacitor C0 is formed laterally with respect to the source/drain region SD of the cell transistor N0. Concomitantly, the top electrode TEL of the ferroelectric capacitor C0 is connected with the source/drain region SD though the first via plug VIA1, the metallic layer L1, and the first via plug VIA1. The bottom electrodes BEL provide the plate lines PL0 to PL3. Just as in the case of the first embodiment, the ferroelectric capacitor C0 is constituted by the bottom electrode BEL and the top electrode TEL and a ferroelectric thin film FERRO that is sandwiched therebetween. One of the source/drain diffusion regions SD provides the local bit line LBL0 in the shared region. Also, the other of the source/drain diffusion regions SD, in this case the drain, is connected with the first metallic layer L1 through the first via plug VIA1 and, in addition, is connected through a separate first via plug VIA1 with the top electrode TEL. Although not shown, the plate line PL0, provided by the bottom electrode BEL, and the plate driver PLDRV (see FIG. 6) are implemented by connecting with the first metallic layer L1 through the first via plug VIA1 formed on the bottom electrode BEL extending in the direction perpendicular to the Figure. This first metallic layer L1 is connected with the plate driver.

Figure 14A:
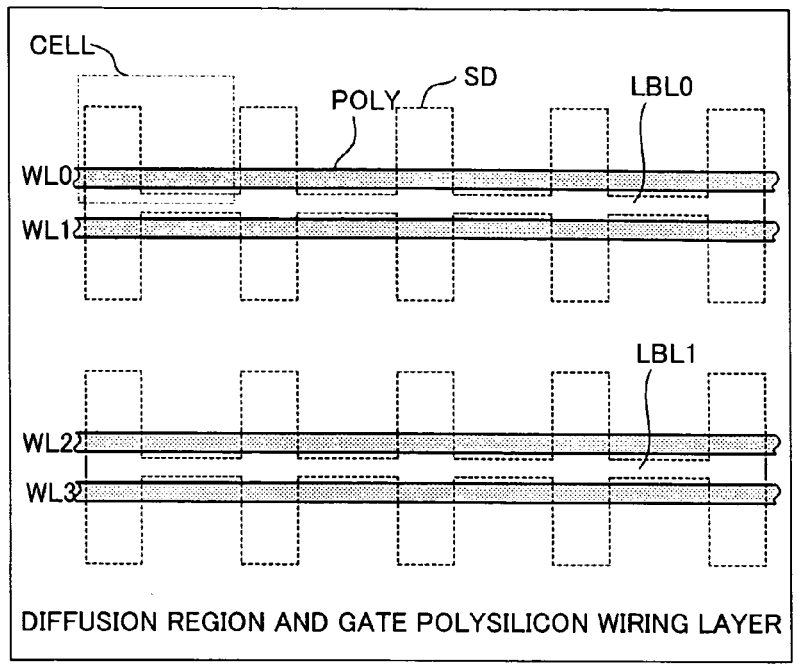
FIG. 14 is an exploded view of the sequence of processing steps of the layout of an memory cell array according to the second embodiment.
Figure 14B:
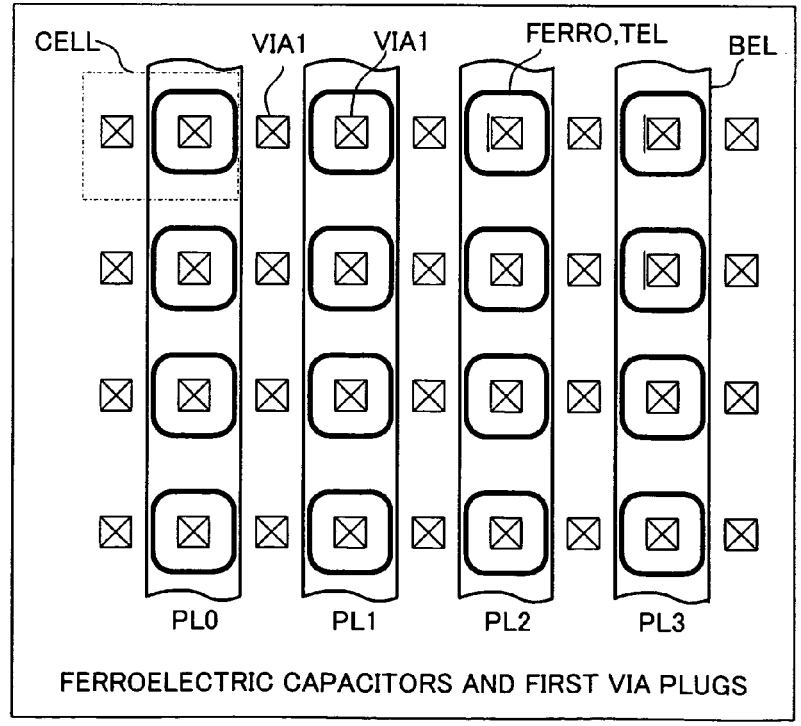
Figure 15:
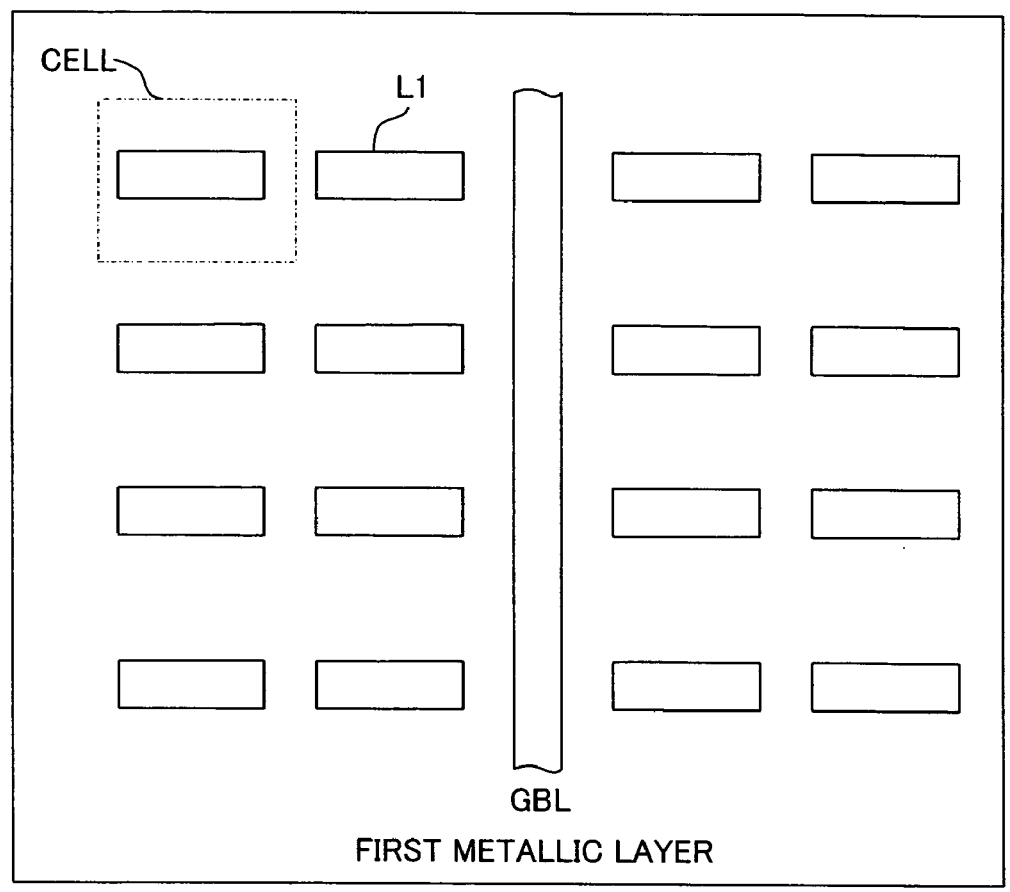
FIG. 15 is an exploded view of the sequence of processing steps of the layout of a memory cell array according to the second embodiment.

FIG. 14 and FIG. 15 are exploded views of the sequence of processing steps of the memory cell array layout in the second embodiment. In FIG. 14A, the source/drain diffusion region SD and gate polysilicon wiring POLY that provide the word lines are formed. In FIG. 14B, the bottom electrodes BEL of the ferroelectric capacitors, the ferroelectric thin film FERRO and the top electrodes TEL are formed. The plate lines PL0 to PL3 are constituted merely by extending the bottom electrodes BEL in the column direction. Also, first via plugs VIA1 are formed on the source/drain region and top electrodes TEL. In FIG. 15, the uppermost first metallic layer L1 is formed. The global bit line GBL, and the wiring that connects the planar type ferroelectric capacitors and the cell transistors is formed by this first metallic layer L1.

In the second embodiment, in the same way as in the case of the first embodiment, the source/drain diffusion region SD of the cell transistor of a memory cell CELL is shared with the source/drain regions SD of the cell transistors of the other memory cells and this shared region constitutes the local bit lines LBL0, LBL1. There is therefore no need to provide a first via plug for connection with the source/drain diffusion region SD and the dimension in the vertical direction of the memory cell can thereby be made smaller than that of a prior art planar type ferroelectric memory. Also, the plate lines are formed by the extension of the bottom electrodes BEL of the ferroelectric capacitors, and the global bit lines that extent parallel with the plate lines are formed by the first metallic layer L1. The metallic layers can thereby be decreased.

The reading and writing operations in the second embodiment are the same as in the first embodiment. Consequently, during reading and writing, no destructive reading of non-selected memory cells is performed and rewriting thereof is therefore also not performed.

As described above, with this embodiment, the local bit lines are formed by the source/drain regions of the cell transistors, so the via plugs for contact purposes in the source/drain regions of the cell transistors of the memory cells become unnecessary and the memory cell dimensions can thereby be shrunk. Also, the number of metallic layers can be cut by making the global bit line and the plate lines parallel. Also, by arranging to select only a single memory cell by orthogonal intersection of a word line and plate line, reading and rewriting of non-selected memory cells can be eliminated. However, for this purpose, a sense amplifier unit is provided so as to maintain the bit lines at L level during the reading operation, and, correspondingly, it becomes necessary to perform control to drive the non-selected plate lines also to H level when a bit line is driven to H level in the rewrite operation.

What is claimed is:
1. A ferroelectric memory comprising:
 a plurality of memory cells respectively having a cell transistor and a ferroelectric capacitor whose one terminal is connected with the cell transistor;
 a plurality of word lines respectively connected with said cell transistors;
 a plurality of plate lines intersecting with said word lines and connected with the other terminal of said ferroelectric capacitors;
 a plurality of local bit lines connected with said cell transistors;
 a global bit line selectively connected with said local bit lines; and
 a sense amplifier unit that, during reading, detects amount of charge delivered to said local bit lines by said memory cells while maintaining the potential of said local bit lines at a potential equal to non-selected plate lines.
2. The ferroelectric memory according to claim 1 further comprising a plate line driver that, when a selected word line is driven, drives the plate line corresponding to said selected memory cell such that reading voltage is applied to said ferroelectric capacitor and maintains said non-selected plate lines corresponding to the non-selected memory cells at a prescribed potential.

3. The ferroelectric memory according to claim 2 wherein, when said local bit line is driven on rewriting to the selected said memory cell, said plate line driver drives the non-selected plate lines also to a potential equivalent to that of the local bit line.

4. The ferroelectric memory according to claim 1 wherein said local bit lines are connected with a plurality of memory cells; said global bit lines are respectively provided in respect of a plurality of local bit lines; and said sense amplifier unit is provided for each said global bit line.

5. The ferroelectric memory according to claim 4 comprising a write circuit provided for each said global bit line and that drives said global bit line to a rewriting level in response to the output of said sense amplifier unit.

6. The ferroelectric memory according to claim 1 wherein said local bit lines are provided parallel with said word lines and the local bit lines are constituted by diffusion regions connected in common with first source/drain regions of a plurality of cell transistors arranged in the direction of the extension of said word lines; and said global bit lines are connected with said local bit lines through a connection circuit and the global bit lines are arranged parallel with plate lines.

7. The ferroelectric memory according to claim 6 wherein said connection circuit connects said local bit line with the global bit line in response to driving of a selected word line.

8. The ferroelectric memory according to claim 6 wherein a contact via is formed in a second source/drain region of the said cell transistor and the second source/drain region is connected with an electrode of the ferroelectric capacitor through said contact via.

9. The ferroelectric memory according to claim 8 wherein said ferroelectric capacitor is formed on the contact via formed in said second source/drain region and a conductive layer providing said plate lines is formed on said ferroelectric capacitor.

10. The ferroelectric memory according to claim 8 wherein said ferroelectric capacitor is formed in a position adjacent to said second source/drain region and said second source/drain region is connected with a top electrode of said ferroelectric capacitor through said contact via and a conductive layer connected with the contact via; and, in addition, the bottom electrode of said ferroelectric capacitor provides said plate line.

11. The ferroelectric memory according to claim 1 wherein said global bit line extends parallel with said plate lines and the global bit line and plate lines are provided by the same conductive layer.

12. The ferroelectric memory according to claim 1 wherein said global bit line extends parallel with said plate lines, said global bit line is provided by a conductive layer and said plate lines are provided by extending one electrode of said ferroelectric capacitor.

13. The ferroelectric memory according to claim 1 wherein said sense amplifier unit comprises a source follower transistor that is connected with said global bit line and whose gate/source voltage is made to be about the threshold voltage; a polarization charge detection capacitor that resets the other terminal of this source follower transistor to negative voltage; and a sense amplifier that detects a voltage change in respect of the amount of polarization charge flowing into the polarization charge detection capacitor from said selected memory cell.

* * * * *